United States Patent
Dokumaci et al.

(10) Patent No.: US 6,657,244 B1
(45) Date of Patent: Dec. 2, 2003

(54) STRUCTURE AND METHOD TO REDUCE SILICON SUBSTRATE CONSUMPTION AND IMPROVE GATE SHEET RESISTANCE DURING SILICIDE FORMATION

(75) Inventors: Omer H. Dokumaci, Wappingers Falls, NY (US); Bruce B. Doris, Brewster, NY (US); Robert J. Purtell, Mohegan Lake, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/195,596

(22) Filed: Jun. 28, 2002

(51) Int. Cl.⁷ .............................................. H01L 29/76
(52) U.S. Cl. ...................... 257/288; 257/336; 257/344; 257/384; 257/388; 257/408; 257/412; 257/413; 438/592; 438/652
(58) Field of Search ................................. 257/389, 262, 257/288, 336, 338, 344, 346, 368, 384, 387, 388, 408, 412, 413, 752; 438/592, 652, 655

(56) References Cited

U.S. PATENT DOCUMENTS

| 4,502,202 A |   | 3/1985  | Malhi |
|---|---|---|---|
| 4,555,843 A |   | 12/1985 | Malhi |
| 4,728,617 A |   | 3/1988  | Woo et al. |
| 4,745,086 A |   | 5/1988  | Parrillo et al. |
| 5,428,240 A | * | 6/1995  | Lur ............................ 257/389 |
| 5,453,389 A |   | 9/1995  | Strain et al. |
| 5,541,427 A | * | 7/1996  | Chappell et al. ............ 257/306 |
| 5,731,239 A |   | 3/1998  | Wong et al. |
| 5,828,102 A |   | 10/1998 | Bergemont |
| 5,856,225 A |   | 1/1999  | Lee et al. |
| 5,893,739 A |   | 4/1999  | Kadosh et al. |
| 6,008,096 A |   | 12/1999 | Gardner et al. |
| 6,060,358 A |   | 5/2000  | Bracchitta et al. |
| 6,060,364 A |   | 5/2000  | Maszara et al. |
| 6,060,387 A |   | 5/2000  | Shepela et al. |
| 6,110,818 A |   | 8/2000  | Haskell |
| 6,153,485 A |   | 11/2000 | Pey et al. |

FOREIGN PATENT DOCUMENTS

JP          6-53507          2/1994

OTHER PUBLICATIONS

Abstract of Japanese Publication No. 09312397, issued Dec. 1997.

* cited by examiner

*Primary Examiner*—Jack Chen
(74) *Attorney, Agent, or Firm*—Scully, Scott, Murphy & Presser; Margaret A. Pepper (57) ABSTRACT

A method of fabricating a semiconductor structure where a low gate resistance is obtained, while simultaneously reducing silicon consumption in the source/drain diffusion regions. The method provides a semiconductor structure having a thin silicide region formed atop source/drain regions and a thicker silicide region formed atop gate regions. The method includes: first forming a structure which includes self-aligned silicide regions atop the source/drain diffusion regions and the gate region. A non-reactive film and a planarizing film are then applied to the structure containing the self-aligned silicide regions and thereafter a thicker silicide region, as compared to the self-aligned silicide region located atop the source/drain regions, is formed on the gate region.

8 Claims, 5 Drawing Sheets

STRUCTURE AND METHOD TO REDUCE SILICON SUBSTRATE CONSUMPTION AND IMPROVE GATE SHEET RESISTANCE DURING SILICIDE FORMATION

RELATED APPLICATIONS

This application is related to and co-assigned U.S. application Ser. No. 09/882,250, filed Jun. 15, 2001, now U.S. Pat. No. 6,586,289, and and co-assigned U.S. application Ser. No. 09/888,160, filed Jun. 22, 2001, now U.S. Pat. No. 6,531,365, the entire contents of each are incorporated herein by reference.

FIELD OF THE INVENTION

The present invention relates to semiconductor device manufacturing, and more particularly to a method of lowering the gate resistance of a metal oxide semiconductor field effect transistor (MOSFET), while simultaneously reducing silicon consumption in the source/drain regions.

BACKGROUND OF THE INVENTION

In the semiconductor industry, there is a need for increasing the gate density and operating speed of integrated circuits (ICs). One way to accomplish increased gate density and operating speed is to decrease the minimum feature size of the MOSFETs within the IC. In typical MOSFET fabrication processes, the formation of source/drain regions by ion implantation and annealing causes some lateral diffusion of dopant beneath the gate region. The extent of lateral diffusion can be limited by providing sidewall spacers about the gate region prior to implanting the source/drain regions. In addition to restricting the lateral diffusion of the source/drain regions under the gate region, the lateral diffusion must also be limited by controlling the depth of the source/drain regions. Typically, the smaller feature sizes used to improve gate density and operating speed also require increasingly shallow source/drain regions.

Another requirement for IC fabrication is the formation of ohmic contacts on the source/drain regions. Ohmic contacts are typically fabricated in the prior art by forming a silicide layer atop the source/drain regions. In addition, the sheet resistance of the Si-containing gate interconnect surfaces must be lowered in order to reduce RC delay across the MOSFET gate. Lower sheet resistance of the gate region is also achieved by forming a silicide layer atop the uppermost Si-containing gate conductor layer.

In typical prior art processes, the ohmic contacts and the silicide atop the gate conductor are formed by deposition of a metal layer over the Si-containing surfaces (i.e., atop the source/drain regions and the uppermost surface of a Si-containing gate conductor) and annealing which converts the metal layer and nearby Si-containing surfaces into a silicide layer. During this process which is referred to in the art as silicidation, some amount of silicide forms downward into the source/drain regions. This causes a problem in cases where the source/drain regions are very shallow, and the silicide (i.e., ohmic contact) thickness is sufficiently large since the silicide may penetrate substantially or completely through the source/drain regions. Substantial or complete penetration of the silicide through the source/drain regions may result in excessive junction leakage during operation causing device failure.

In order to reduce such junction leakage, the amount of metal used in forming the silicide layer of the source/drain regions may be reduced. Lower amounts of deposited metal typically correlate to a thinner silicide layer being formed. Although it is desirable to have thin silicide formation atop the source/drain regions, the reduced thickness of the silicide layer is generally not warranted atop the gate regions since it leads to increased sheet resistance of the gate interconnects. This increased sheet resistance, in turn, will increase the RC delay across the MOSFET gate thereby reducing high frequency circuit performance.

U.S. Pat. No. 6,060,387 to Shepela, et al. provides a process for forming a transistor in an IC where two silicide formation steps, which are independent of each other, are employed in forming a thin silicide layer over the source/drain regions and a thicker silicide layer over the gate conductor. Specifically, in this prior art process, a structure including a gate interconnect and source/drain regions is first provided. A first silicide layer is provided on the surface of the source/drain regions. A gap fill layer having a thickness that is greater than the height of the gate interconnect structure is deposited, and thereafter the gap fill layer is planarized using chemical-mechanical polishing (CMP) to expose top surfaces of the interconnect. A second relatively thick silicide layer is formed on the top surface of the gate interconnect. The process disclosed in Shepela, et al. reportedly provides a sufficiently low resistance, thin silicide layer over the source/drain regions, while also creating a lower resistance, relatively thicker silicide layer over the gate interconnect material.

U.S. Pat. No. 6,153,485 to Pey, et al. discloses a method where source/drain silicide contacts are formed in a separate silicide step than the gate silicide contacts. In accordance with the process disclosed in the '485 patent, a $TiSi_2$ layer is formed over the source/drain regions while the gate electrode is protected by a silicon nitride cap layer. An interlevel dielectric (ILD) layer is formed over the source/drain regions, planarized via CMP, and thereafter, the ILD layer, silicon nitride cap layer and spacers on the sidewalls of the gate electrodes are etched back. A second silicide layer is then formed atop the exposed gate electrode surfaces.

In both prior art processes mentioned above, CMP or another like planarization processing step is required to provide a thick silicide layer atop the gate conductor region. The use of CMP or another like planarization process is undesirable, not only because it adds additional processing steps and cost to the overall fabrication process, but it is oftentimes difficult to stop the planarization process on the uppermost surface of the gate conductor material.

In view of the above problems with prior art processes of forming a semiconductor structure having a thin silicide located atop source/drain regions and a thick silicide region located atop the gate region, there is a continued need to provide a new and improved method which avoids the use of CMP or another like planarization method in forming such a structure.

SUMMARY OF THE INVENTION

One object of the present invention is to provide a method of fabricating a semiconductor structure in which a thick silicide region is formed atop the gate region, while simultaneously obtaining a thin silicide region atop the source/drain regions.

Another object of the present invention is to provide a method of fabricating a semiconductor structure where a low gate resistance is obtained, while simultaneously reducing silicon consumption in the source/drain diffusion regions.

A further object of the present invention is to provide a method of fabricating a semiconductor structure having a thin silicide region formed atop the source/drain regions and a thicker silicide region formed atop the gate region which employs processing steps which are compatible with existing MOSFET manufacturing processes.

A yet further object of the present invention is to provide a method of fabricating a semiconductor structure having a thin silicide layer formed atop the source/drain regions and a thicker silicide region formed atop the gate region which does not require using CMP or another like planarization process in forming the thicker silicide region atop the gate region.

These and other objects and advantages are obtained in the present invention by first forming a structure which includes self-aligned silicide regions atop the source/drain diffusion regions and the gate region. A non-reactive film and a planarizing film are then applied to the structure containing the self-aligned silicide regions and thereafter a thicker silicide region, as compared to the self-aligned silicide region located atop the source/drain regions, is formed on the gate region.

In broad terms, the method of the present invention comprises the steps of:

providing a MOSFET structure comprising first silicide regions of a first thickness atop source/drain diffusion regions and a patterned gate region;

forming a non-reactive film on said structure including atop said patterned gate region;

forming a planarizing film on said structure, said planarizing film is substantially coplanar with an exposed upper horizontal surface of said non-reactive film that is present atop the patterned gate region;

selectively removing the exposed portion of said non-reactive film so as to expose the first silicide region present atop the patterned gate region;

selectively removing the planarizing film from said structure; and forming a second silicide region atop the patterned gate region that is thicker than the first silicide region located atop the source/drain diffusion regions.

The present invention also provides a semiconductor structure which is formed during the process of the present invention. Specifically, the inventive structure comprises:

a semiconductor substrate having at least one patterned gate region located on a surface thereon, said substrate containing source/drain diffusion regions abutting said at least one patterned gate region;

silicide regions located atop said source/drain diffusion regions and an upper portion of said at least one patterned gate region;

a non-reactive film located atop the silicide regions as well as exposed vertical portions of said at least one patterned gate region; and a planarizing film located atop said non-reactive film, wherein said planarizing film has an upper horizontal surface that is coplanar with an upper surface of said non-reactive film which overlays said at least patterned gate region.

DETAILED DESCRIPTION OF THE INVENTION

The present invention, which provides a method of fabricating a semiconductor structure having a thin silicide region formed atop the source/drain regions and a thicker silicide region formed atop the gate region, will now be described in greater detail by referring to the drawings that accompany the present application.

Figure 1A:
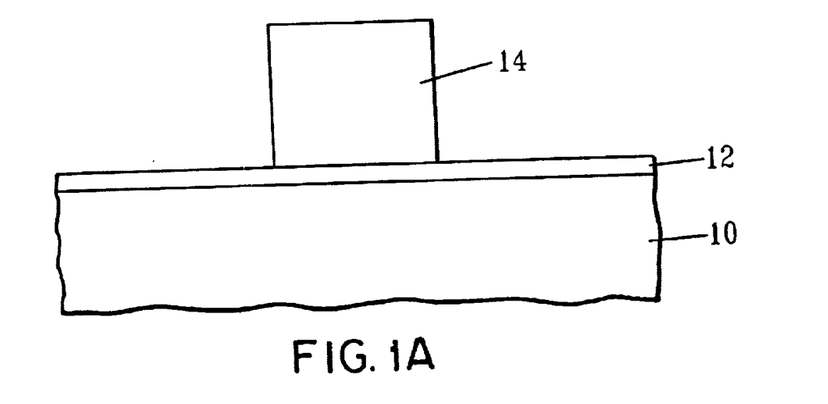
FIGS. 1A–1K are pictorial representations (through cross-sectional views) showing the basic processing steps of one embodiment of the present invention.

Reference is first made to FIG. 1A which illustrates an initial structure that is employed in the present invention. Specifically, the initial structure shown in FIG. 1A comprises semiconductor substrate 10, gate dielectric material 12 formed on a surface of semiconductor substrate 10, and at least one patterned gate conductor 14 formed on a portion of gate dielectric material 12. It should be noted that although the drawings show the presence of only a single patterned gate conductor formed atop gate dielectric material 12, the present invention works equally well when a plurality of patterned gate conductors are employed.

The structure shown in FIG. 1A is comprised of conventional materials well known in the art and it is fabricated utilizing processing steps that are also well known in the art. For example, semiconductor substrate 10 comprises any semiconducting material including, but not limited to: Si, Ge, SiGe, GaAs, InAs, InP and all other III/V semiconductor compounds. Semiconductor substrate 10 may also include a layered substrate comprising the same or different semiconducting material, e.g., Si/Si or Si/SiGe, as well as a silicon-on-insulator (SOI) substrate. The substrate may be of the n- or p-type depending on the desired device to be fabricated.

Additionally, semiconductor substrate 10 may contain active device regions, wiring regions, isolation regions, well regions or other like regions that are typically present in MOSFET-containing devices. For clarity, these regions are not shown in the drawings, but are nevertheless meant to be included within region 10. In one highly preferred embodiment of the present invention, semiconductor substrate 10 is comprised of Si or an SOI substrate.

A gate dielectric material such as an oxide, nitride, oxynitride or any combination and multilayer thereof, may be formed on a surface of semiconductor substrate 10 utilizing a deposition process such as chemical vapor deposition (CVD), plasma-assisted CVD, evaporation, atomic layer deposition or chemical solution deposition (CSD). Alternatively, the gate dielectric material may be formed by a thermal growing process such as oxidation, nitridation or oxynitridation.

The thickness of the gate dielectric material formed at this point of the present invention is not critical to the present invention, but typically, gate dielectric material 12 has a thickness of from about 1 to about 20 nm after deposition, with a thickness of from about 1.5 to about 10 nm being more highly preferred. It is noted that the gate dielectric material employed in the present invention may be a conventional dielectric material such as $SiO_2$ or $Si_3N_4$, or alternatively, high-k dielectrics such as oxides of Ta, Zr, Hf, Al or combinations thereof may be employed. In one highly preferred embodiment of the present invention, gate dielectric material 12 is comprised of an oxide such as $SiO_2$, $ZrO_2$, $HfO_2$, $Ta_2O_5$ or $Al_2O_3$.

After forming gate dielectric material 12 on a surface of semiconductor substrate 10, at least one patterned gate conductor 14 is formed atop the layer of gate dielectric. The patterned gate conductor is formed utilizing a conventional process which includes the steps of: depositing at least a gate material on the gate dielectric material, and patterning the gate material via lithography and etching. The gate material may be deposited by CVD, plasma-assisted CVD, evaporation, plating or chemical solution deposition, while the lithography step includes applying a photoresist to the gate material, exposing the photoresist to a pattern of radiation and developing the pattern utilizing a conventional developer solution. Etching is performed utilizing a dry etching process such as reactive-ion etching, plasma etching, ion beam etching or laser ablation. Following the etching process, the photoresist is removed from the structure utilizing a conventional stripping process well known in the art so as to provide the structure shown, for example, in FIG. 1A.

In one embodiment of the present invention (not shown in the drawings), the exposed portions of the gate dielectric (not containing the patterned resist or the patterned gate conductor) is etched at this point of the present invention. This provides an initial structure having exposed surfaces of semiconductor substrate 10 and patterned gate regions that include patterned gate conductors formed atop patterned gate dielectrics. Although the present invention contemplates removing the gate dielectric at this point of the inventive process, it is preferred to keep the gate dielectric material on the substrate during the various implants used in the present invention. Following the various implant steps, in particularly, the ion implantation of the source/drain regions, portions of the gate dielectric, which are not underneath either the sidewall spacers or the patterned gate conductor, are removed. This embodiment of the present invention will be described in greater detail hereinbelow.

It is noted that each of patterned gate conductors 14 shown in FIG. 1A includes at least a gate material in which at least the top portion thereof is composed of a Si-containing material such as polysilicon or amorphous Si. The term "gate material" as used herein denotes a conductive material, a material that can be made conductive via a subsequent process such as ion implantation, or any combination thereof. Illustrative examples of suitable gate materials that can be employed in the present invention include, but are not limited to: polysilicon, amorphous silicon, SiGe, SiGeC, elemental metals such as W, Pt, Pd, Ru, Rh and Ir, alloys of said elemental metals, silicides or nitrides of these elemental metals, and combinations thereof, e.g., a gate stack including a layer of polysilicon and a layer of conductive metal. A highly preferred gate material employed in the present invention is a gate material that is comprised of polysilicon or amorphous silicon.

It is noted that in embodiments wherein a gate stack is employed, e.g., a stack of polysilicon and elemental metal, an optional diffusion barrier (not shown in the drawings) may be formed between each layer of the gate stack. The optional diffusion barrier, which is formed utilizing conventional deposition processes such as those mentioned hereinabove, is comprised of a material such as SiN, TaN, TaSiN, WN, TiN and other like materials which can prevent diffusion of a conductive material therethrough.

At this point of the inventive method, source/drain extension regions 16 and optional halo implant regions (not shown) are formed in the semiconductor substrate. Specifically, the source/drain extensions and the optional halo implants are formed by separate ion implantation steps using implant conditions well known to those skilled in the art. Any n-type or p-type dopant species may be employed in forming the extension implant regions. An optional anneal step may follow the implant steps. Although various annealing conditions may be employed in the present invention, it is preferred that annealing be conducted using a rapid thermal anneal (RTA) process which is carried out at a temperature of from about 900° to about 1150° C. for a time period of from a few milliseconds to about a minute or more.

Figure 1B:
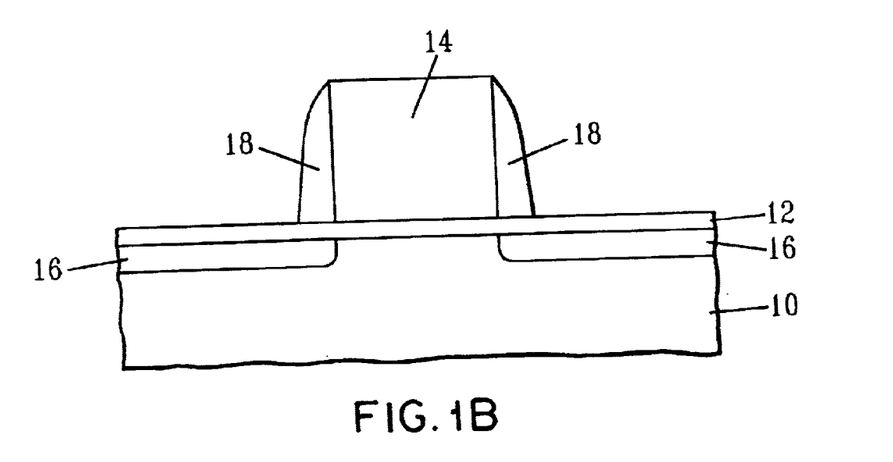

Next, sidewall spacers 18 are formed atop the gate dielectric (or if the gate dielectric has already been removed, atop the substrate) so as to cover exposed vertical sidewalls of the patterned gate conductors by deposition and anisotropic etching. The sidewall spacers are composed of any insulator material including oxides, nitrides, oxynitrides or any combination thereof including multilayers. A highly preferred insulator material for sidewall spacers 18 is a nitride such as SiN. The structure including the source/drain extension implants and sidewalls spacers is shown, for example, in FIG. 1B.

Figure 1C:
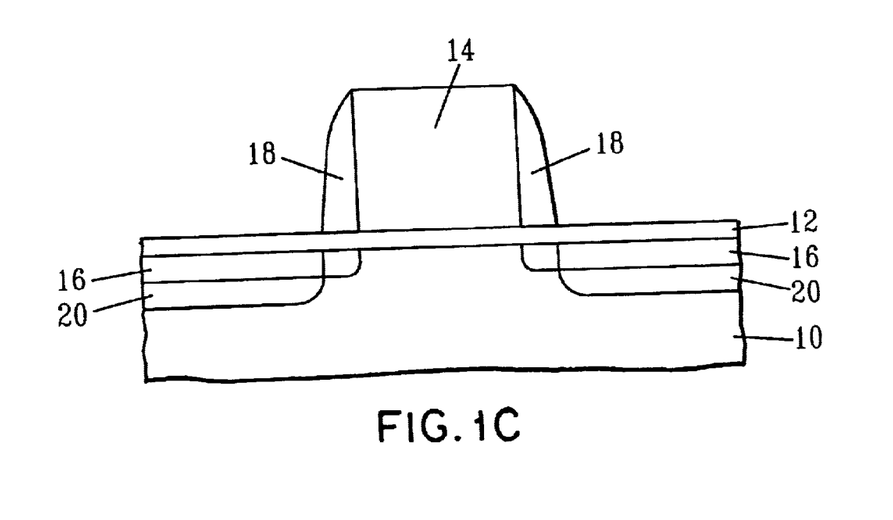

Next, and as illustrated in FIG. 1C, source/drain regions 20 are formed into substrate 10 by ion implantation and annealing. The ion implantation step, which includes the use of n-type dopant species as well as p-type dopant species, is carried out using implant conditions well known to those skilled in the art. The annealing step is performed using any anneal conditions that are capable of activating the source/drain regions. Preferably, this annealing step is performed using a RTA process that is carried out at a temperature of from about 900° to about 1150° C. for a time period of from a few milliseconds to about a minute or more.

At this point of the present invention, and if not previous done, gate dielectric material 12 that is not protected by either the sidewall spacers or the patterned gate conductor is removed utilizing a conventional etching process that is highly selective in removing the exposed gate dielectric from the structure. The resultant structure that is formed after this etching step is performed is shown, for example, in FIG. 1D. In this drawing and in the remaining drawings, the patterned gate dielectric, patterned gate conductor and sidewall spacers are referred to as patterned gate region 22.

Figure 1D:
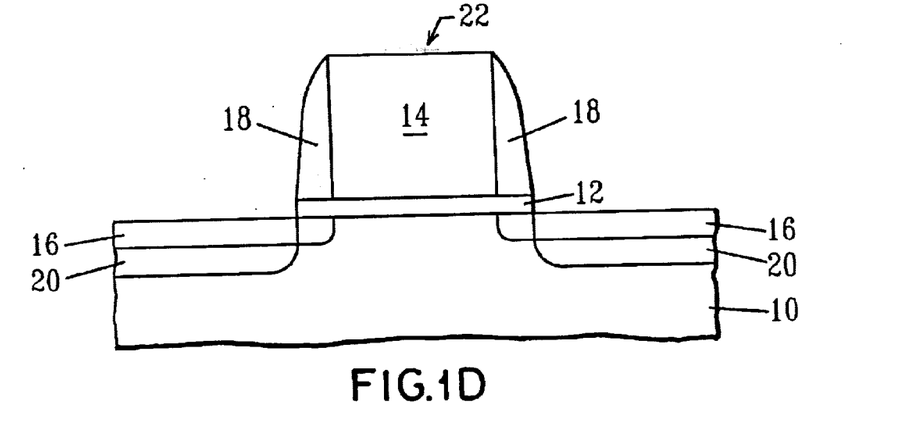
Figure 1E:
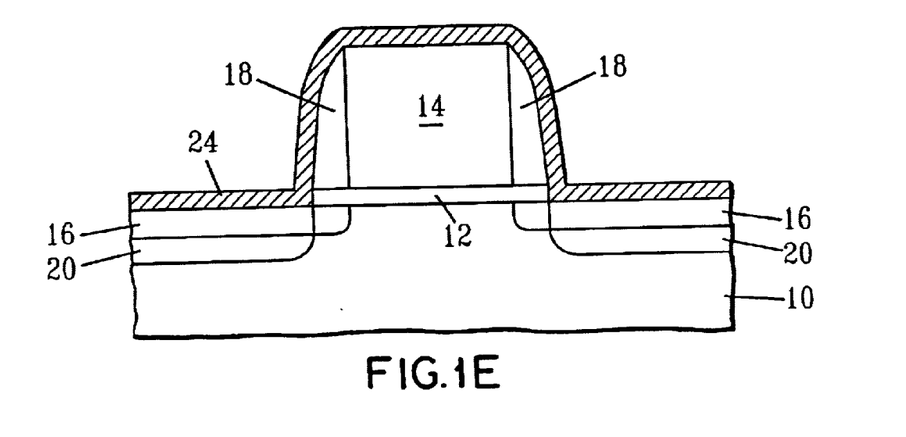

Next, and as shown in FIG. 1E, metal layer 24 is formed atop all exposed surfaces of the structure shown in FIG. 1D utilizing a conventional deposition process such as chemical vapor deposition, physical vapor deposition, metal organic chemical vapor deposition, evaporation or electroplating. The metal layer is comprised of any metal which, when present atop a Si-containing surface, is capable of being converted into a silicide when subjected to annealing. In the structure illustrated, silicide will be formed over source/drain regions 20 as well on the top horizontal surface of patterned gate region 22. Suitable metals for metal layer 24 include, but are not limited to: Co, Pd, Pt, Ni, Ti or W. A highly preferred metal for metal layer 24 is Co. The thickness of the metal layer formed at this point of the present invention may vary, typically however, metal layer 24 has a thickness, after deposition, of from about 50 to about 200 Å.

A capping layer (not shown) such as TiN may then be formed atop metal layer to protect the metal layer from the atmosphere during annealing. Annealing is performed to form first silicide regions 26 in areas of the structure which include a metal layer/Si-containing interface. Annealing is performed at this step of the present invention at a temperature of about 520° C. or higher for a time period of from about 1 second or greater. Preferably, and in embodiments when Co is employed as the metal layer, annealing is performed at a temperature of about 550° C. for about 90 seconds. Annealing is typically performed in an inert gas ambient such as He, Ar, $N_2$, Xe, or Kr. Mixtures of the aforementioned inert gases such as He—Ar or Ar—$N_2$ are also contemplated in the present invention.

After the annealing is performed, the capping layer is removed from the structure using a chemical etchant that is highly selective in removing the capping layer. For example, when TiN is employed, the TiN layer is removed after annealing using a peroxide sulfuric solution. Any non-reacted metal, not converted into a silicide, that may be present atop the capping layer is first removed using a chemical etchant that does not attack silicide. An exemplary selective wet etchant that can be employed in removing the non-reacted metal is a solution of nitric acid.

It should be noted that in some embodiments of the present, a second annealing step may follow the initial silicide anneal. When a second annealing step is employed, the second annealing is carried out at a temperature of about 700° C. or greater for a time period of about 1 minute or less.

Figure 1F:
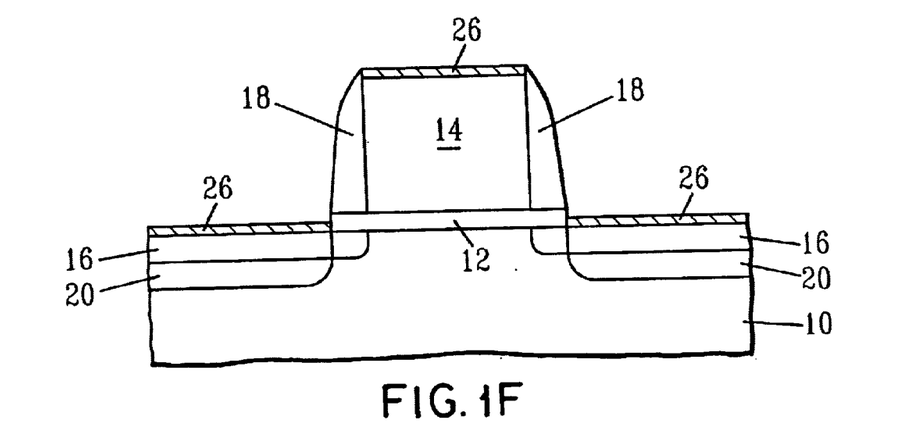

The resultant structure including first silicide regions 26 is shown in FIG. 1F. First slicide regions 26 are thin, self-aligned silicide regions whose thickness does not substantially penetrate through the source/drain regions. Moreover, the first silicide regions are thinner than the second silicide regions to be subsequently formed herein. The term "thin" silicide is used herein to denote a silicide region having a thickness of from about 10 to about 50 nm, with a thickness of from about 20 to about 40 nm being more highly preferred.

Figure 1G:
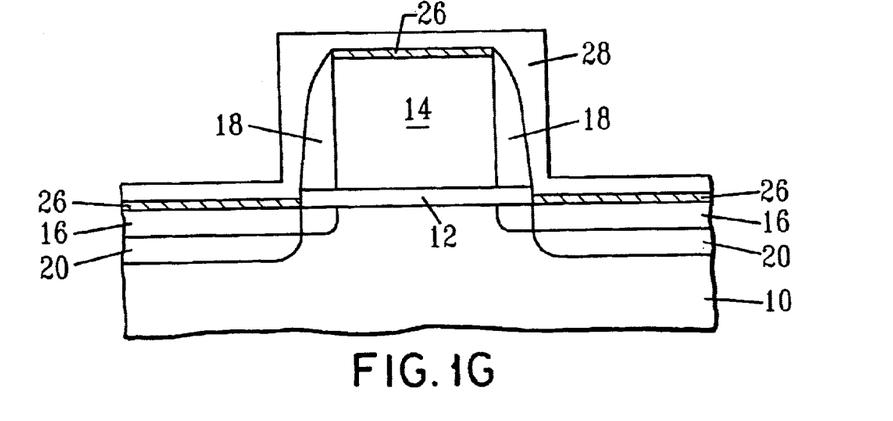

FIG. 1G shows the structure that is formed after non-reactive film 28 is formed on all vertical and horizontal surfaces of the structure. It is noted that the non-reactive film is a conformal film which follows the contour of the structure shown in FIG. 1F. Non-reactive film 28 is formed by a conventional -deposition process such as, but not limited to: plasma enhanced chemical vapor deposition and chemical vapor deposition. Alternatively, the non-reactive film is formed by a thermal growing process such as oxidation (including low-temperature oxidation and ozone tetraethylorthosilicate (TEOS)) or nitridation.

The non-reactive film employed at this point of the present invention may be a nitride or, more preferably, an oxide. The thickness of non-reactive film 28 may vary depending upon the process used in forming the same. Typically, however, non-reactive film 28 has a thickness of from about 50 to about 500 Å.

Figure 1H:
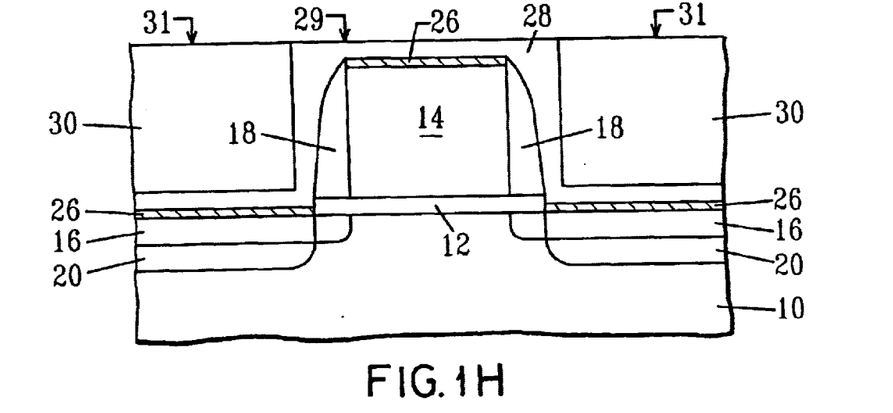

Next, planarizing film 30 is formed atop the structure shown in FIG. 1G providing the structure shown in FIG. 1H. As shown, the resultant structure contains a planarizing film having an upper surface 31 that is substantially coplanar with exposed horizontal surface 29 of non-reactive film 28.

The planarizing film is formed in the present invention utilizing any deposition process that is capable of forming such a layer on a structure. For example, CVD, plasma-assisted CVD, evaporation, chemical solution deposition or spin-on coating may be employed in forming the planarizing film on the structure containing the patterned gate regions. If needed, the deposited planarizing film may be baked at a temperature which is capable of removing any residual solvent from the film. When a baking step is employed, the baking step is typically carried out at a temperature of from about 150° to about 250° C. It is noted that the baking temperature is dependent on the type of planarizing film that is employed, thus the baking temperature may vary somewhat for those mentioned herein.

The above steps of deposition and baking may be repeated any number of times, as required. It is noted that multiple coatings with bakes in between each coating provides a more planar film and it also allows the film to be applied to any desired thickness. The total thickness of the planarizing film that is formed at this point of the present invention is dependent on the height of the gate region. Typically, the planarizing film has a height of from about ½ to about 3 times the height of the gate region, with a thickness of from about 500 Å smaller than the height of the gate region to about 500 Å taller than the height of the gate region.

The planarizing film that is employed in the present invention typically includes an organic polymer or mixtures of such organic polymers. Illustrative examples of suitable planarizing organic films that can be employed in the present invention include, but are not limited to: antireflective coatings, polyimide or other organic polymers that do not image during a subsequent imaging process. Of these planarizing organic films, it is highly preferred to use antireflective coatings such as AR3 and DUV 30 (each sold by Brewers Science, LTD) as the planarizing film. In instances when the non-reactive film is comprised of a nitride, it is possible to use an oxide such as TEOS as the planarizing film.

In some embodiments of the present invention, it is possible to provide a planarizing film that extends above the upper horizontal surface of the non-reactive layer. In such a instance, the planarizing film may be subjected to a conventional etch back process so as to remove the planarizing film from the top horizontal surface of each of the patterned gate regions so as to provide a structure similar to the one depicted in FIG. 1H. Examples of possible etch back processes that can be employed in the present invention include, but are not limited to: a reactive-ion etch back process or a chemical wet etch process wherein an etchant that has a high selectivity for removing planarizing film as compared to gate material can be employed.

Figure 1I:
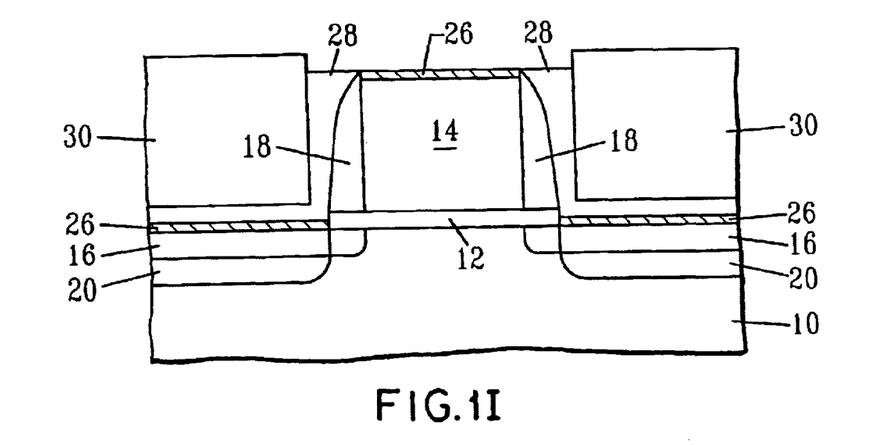

Next, and as shown in FIG. 1I, the exposed portion of the upper horizontal surface of the non-reactive film is removed via a selective etching process so as to expose the first silicide region atop the patterned gate region. When the non-reactive film is an oxide, the oxide film can be selectively removed with HF at room temperature. Alternatively, the exposed portions of the non-reactive film can be selectively removed via a dry etching process, which employs, for example, $CHF_3/CF_4$ chemistry.

Figure 2A:
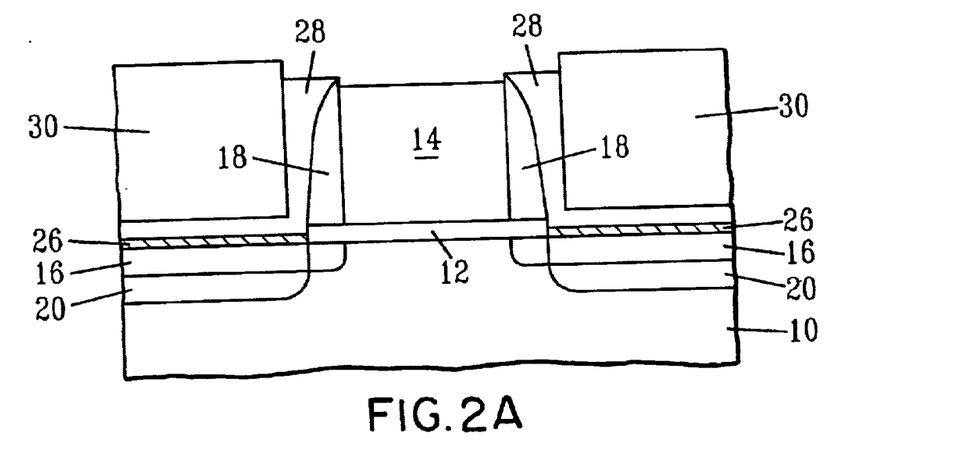
FIGS. 2A–2C are pictorial representations (through cross-sectional views) showing the basic processing steps of another embodiment of the present invention.

In embodiments where the second silicide region is to be different from the first silicide region, the first silicide region formed atop the patterned gate region can be removed at this point of the process providing the structure shown in FIG. 2A. Specifically, the first silicide region atop the patterned gate region is etched selectively to the planarizing film and the gate material utilizing wet or dry etching. When a dry etching process is employed, $CHF_3/CF_4$ chemistry can be employed. In embodiments where a chemical wet etch process is utilized, dilute HF or another like etchant can be employed.

Figure 1J:
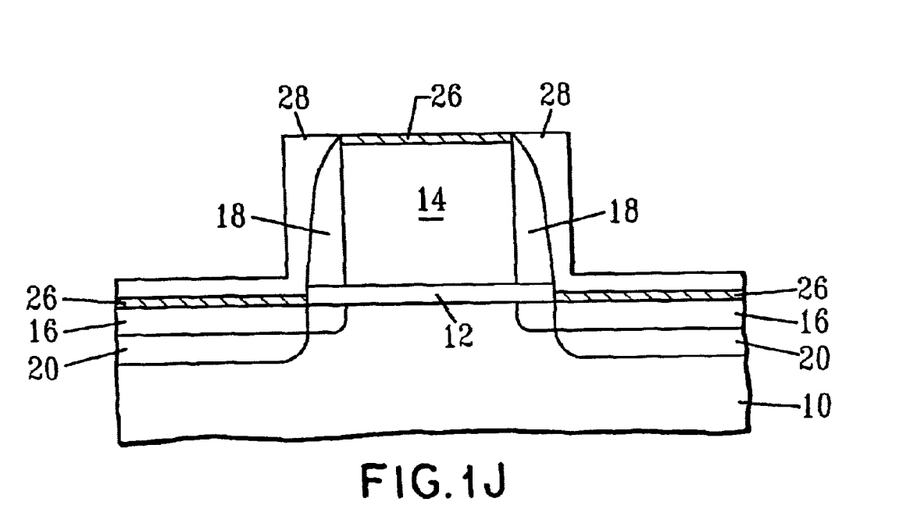
Figure 2B:
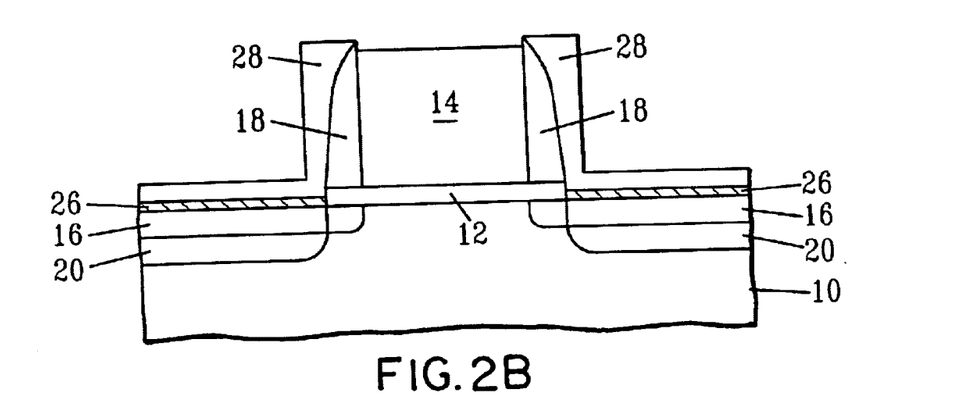

Next, the structure shown in either FIG. 1I (or alternatively FIG. 2A) is then subjected to a processing step in which the planarizing film is removed from the structure so as to provide the resultant structure shown in FIG. 1J (or alternatively FIG. 2B). Specifically, the planarizing film is removed using a selective etching process wherein a chemical etchant such as, for example, acetone, sulfuric peroxide, or sulfuric nitric acid is employed. In addition to a wet chemical etching process, the planarizing film may be selectively removed by a dry etching process where $O_2$ plasma or $N_2$ and $O_2$ plasma are employed.

Figure 2C:
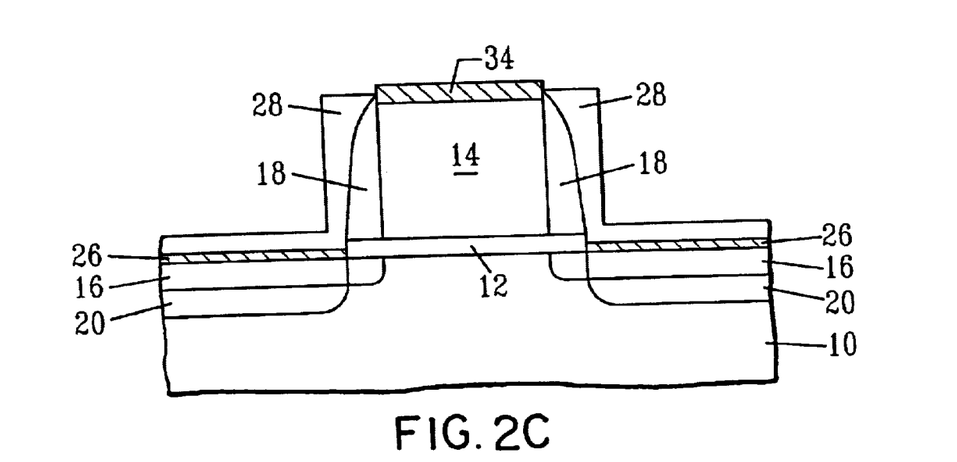

Following the selective removal of the planarizing film from the structure, the structure shown in FIG. 1J or FIG. 2B is then subjected to a process in which a second silicide region, which is thicker than the first silicide region, is formed atop the patterned gate region. In the case of the structure shown in FIG. 2B, second silicide region 34 is formed utilizing the silicidation process, including metal deposition and annealing, mentioned above in forming the first silicide layer. The resultant structure after the silicidation process is shown in FIG. 2C.

Figure 1K:
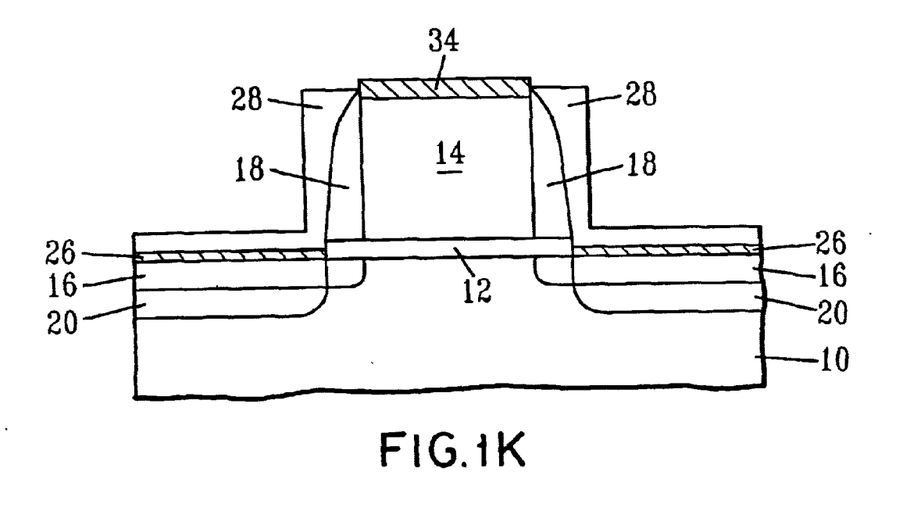

In embodiments where the first silicide region was not previously removed from atop the patterned gate region, a Si layer and a metal layer are first formed on the exposed portion of the first silicide region that overlays the patterned gate region and thereafter the above silicide annealing conditions are performed. The resultant structure utilizing this embodiment of the present invention is shown in FIG. 1K. This particular embodiment of the present invention is typically employed when the first and second silicide regions are composed of the same metal silicide material. Note when the first and second silicide regions are formed of the same material the total thickness of the first and second silicide regions atop the patterned gate region is thicker than the first silicide region that was previously formed atop the source/drain regions.

In both embodiments mentioned above, the second silicide region that is formed atop the patterned gate region is thicker than the first silicide region that is formed atop the source/drain regions. The term "thick" silicide is employed in the present invention to denote a silicide having a total thickness of from about 10 to about 300 nm, with a total thickness of from about 20 to about 150 nm, being more highly preferred. In some cases, it is preferable to convert the whole gate into silicide.

The method of the present invention thus provides a semiconductor structure having thick silicide regions atop the gate region, and thinner silicide regions formed atop the source/drain regions. The inventive method thus forms a semiconductor structure that has improved gate sheet resistance without substantial consumption of substrate material. Another benefit of the inventive method is that the disadvantages of abrasive planarization processing steps like CMP are avoided.

While the present invention has been particularly shown and described with respect to preferred embodiments thereof, it will be understood by those skilled in the art that the foregoing and other changes in forms and details may be made without departing from the spirit and scope of the present invention. It is therefore intended that the present invention not be limited to the exact forms and details described and illustrated, but fall within the scope of the appended claims.

What is claimed is:

1. A semiconductor structure comprising:
   a semiconductor substrate having at least one patterned gate region located on a surface thereof, said semiconductor substrate containing source/drain diffusion regions abutting said at least one patterned gate region and said at least one patterned gate region comprising an upper exposed portion that comprises a Si-containing material;
   silicide regions located on said source/drain diffusion regions and said upper exposed portion of said at least one patterned gate region;
   a non-reactive film located atop the silicide regions as well as exposed vertical portions of said at least one patterned gate region; and
   a planarizing film located atop said non-reactive film, wherein said planarizing film has an upper horizontal surface that is coplanar with an upper surface of said non-reactive film which overlays said at least one patterned gate region.

2. The semiconductor structure of claim 1 wherein said semiconductor substrate is comprised of Si or a SOI material.

3. The semiconductor structure of claim 1 wherein said at least one patterned gate region comprises a patterned gate material, a patterned gate dielectric material and sidewall spacers.

4. The semiconductor structure of claim 1 wherein said non-reactive film is comprised of an oxide or nitride.

5. The semiconductor structure of claim 1 wherein said planarizing film is an organic planarizing film.

6. The semiconductor structure of claim 5 wherein said organic planarizing film is an antireflective coating or a polyimide.

7. The semiconductor structure of claim 1 wherein said non-reactive film is comprised of a nitride and said planarizing film is an oxide.

8. The semiconductor structure of claim 1 wherein said silicide regions comprise cobalt silicide.

* * * * *